United States Patent
Ahn et al.

(10) Patent No.: US 10,198,541 B2
(45) Date of Patent: Feb. 5, 2019

(54) CIRCUIT MODELING SYSTEM AND CIRCUIT MODELING METHOD BASED ON NET LIST SIMPLIFICATION TECHNIQUE

(71) Applicant: Samsung Electronics Co., Ltd., Suwon-Si, Gyeonggi-Do (KR)

(72) Inventors: Soo-Yung Ahn, Seoul (KR); Young-Hoe Cheon, Suwon-si (KR); Chan-Seok Hwang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1079 days.

(21) Appl. No.: 14/574,727

(22) Filed: Dec. 18, 2014

(65) Prior Publication Data

US 2015/0186576 A1   Jul. 2, 2015

(30) Foreign Application Priority Data

Dec. 27, 2013  (KR) .................. 10-2013-0165543

(51) Int. Cl.
*G06F 7/50* (2006.01)
*G06F 17/50* (2006.01)

(52) U.S. Cl.
CPC .................. *G06F 17/5036* (2013.01)

(58) Field of Classification Search
CPC ................................. G06F 17/5036
USPC .......................................... 703/14
See application file for complete search history.

(56) References Cited

U.S. PATENT DOCUMENTS

| | | | |
|---|---|---|---|
| 6,138,267 A | 10/2000 | Mural | |
| 6,748,572 B2 | 6/2004 | Fujine | |
| 6,856,148 B2 | 2/2005 | Bodenstab | |
| 7,509,596 B2 | 3/2009 | Koo et al. | |
| 8,595,677 B1* | 11/2013 | Shu | G06F 17/5036 716/100 |
| 2003/0212538 A1 | 11/2003 | Lin et al. | |
| 2008/0098340 A1 | 4/2008 | Oh | |
| 2008/0209366 A1* | 8/2008 | Che | G06F 17/5036 716/136 |

(Continued)

FOREIGN PATENT DOCUMENTS

JP   2003-006267 A   1/2003
JP   2003-085233 A   3/2003

(Continued)

*Primary Examiner* — Eunhee Kim

(74) *Attorney, Agent, or Firm* — Harness, Dickey & Pierce, P.L.C.

(57) ABSTRACT

A circuit modeling system includes a store a first net list. The first net list includes a plurality of semiconductor devices, a first power distribution network (PDN) connected to the plurality of semiconductor devices, and a signal network connected to the plurality of semiconductor devices that transmits signals to the plurality of semiconductor devices. A circuit simulation unit is configured to identify first semiconductor devices and second semiconductor devices from among the plurality of semiconductor devices. The first semiconductor devices are activated by receiving a signal through the signal network, and the second semiconductor devices are inactive. The circuit simulation unit is configured to reduce the first PDN to a second PDN based on the identified first semiconductor devices, and to generate a second net list including the signal network, the second PDN, and the first semiconductor devices.

20 Claims, 7 Drawing Sheets

(56) References Cited

U.S. PATENT DOCUMENTS

2010/0192115 A1\* 7/2010 Yang ................... G06F 17/5022
                                                        716/104
2011/0270598 A1\* 11/2011 Zou ..................... G06F 17/5036
                                                        703/14

FOREIGN PATENT DOCUMENTS

| JP | 2004-078428 A | 3/2004 |
| JP | 2006-031542 A | 2/2006 |
| JP | 2011-028644 A | 2/2011 |

\* cited by examiner

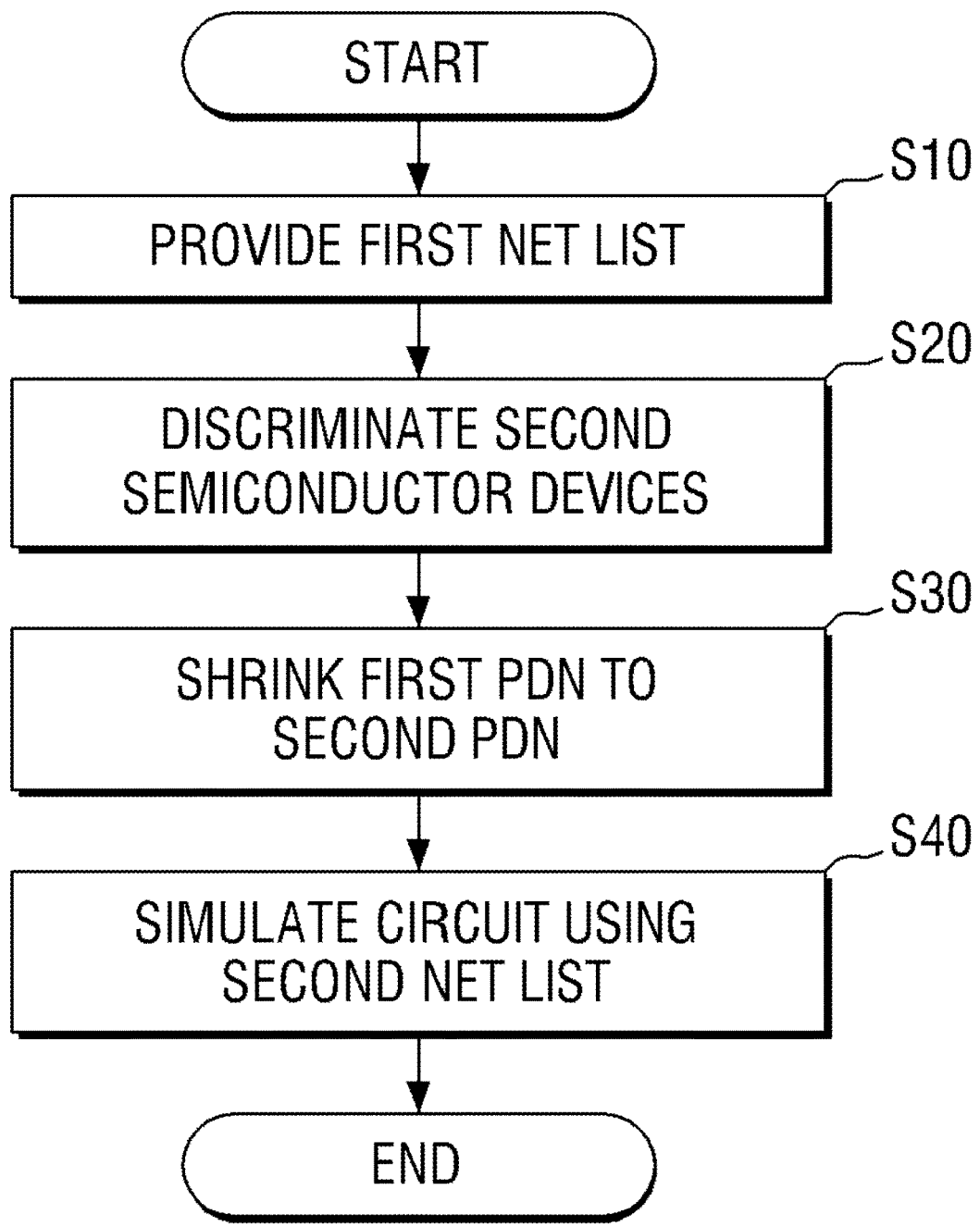

CIRCUIT MODELING SYSTEM AND CIRCUIT MODELING METHOD BASED ON NET LIST SIMPLIFICATION TECHNIQUE

CROSS-REFERENCE TO RELATED APPLICATION

This application claims priority from Korean Patent Application No. 10-2013-0165543 filed on Dec. 27, 2013 in the Korean Intellectual Property Office, and all the benefits accruing therefrom under 35 U.S.C. § 119, the contents of which in its entirety are herein incorporated by reference.

BACKGROUND

1. Field

The inventive concepts relate to a circuit modeling system, a circuit modeling method, and a computer-readable recording medium.

2. Description of the Related Art

In general, more than tens of millions of devices are arranged in a semiconductor device, and the semiconductor device includes a power distribution network (PDN) for supplying power to the elements. As semiconductor devices become more miniaturized and an integration level of semiconductor devices gradually increases, noises generated from the PDN may increasingly affect circuits incorporated into the semiconductor device. The noises generated from the PDN may be caused by parasitic resistances and parasitic capacitances of the PDN. In order to identify effects of noises exerted on operations of the semiconductor device, simulation is typically performed using the circuit layout.

However, as the integration level of devices increases, a simulation execution time also drastically increases. Accordingly, it may be relatively difficult to identify the effect of noises exerted on the operations of the semiconductor device.

SUMMARY

The inventive concepts provide a circuit modeling system, which can perform simulation by reducing a simulation execution time.

At least one example embodiment relates to a circuit modeling system.

According to an example embodiment, a circuit modeling system includes a storage device and a processor. The storage device is configured to store a first net list. The first net list includes (i) a plurality of semiconductor devices, (ii) a first power distribution network (PDN) connected to the plurality of semiconductor devices, and (iii) a signal network connected to the plurality of semiconductor devices, where the signal network is configured to transmit signals to the plurality of semiconductor devices. The processor includes a circuit simulation unit configured to simulate a circuit with the first net list. The circuit simulation unit includes an operating identification module configured to identify first semiconductor devices and second semiconductor devices from among the plurality of semiconductor devices. The first semiconductor devices being ones from among the plurality of semiconductor devices that are activated by receiving the signal through the signal network. The second semiconductor devices are ones from among the plurality of semiconductor devices that are inactive. The circuit simulation unit includes a PDN enhancement module configured to reduce the first PDN to a second PDN based on the identified first semiconductor devices, and a net list simplification module configured to generate a second net list including the signal network, the second PDN, and the first semiconductor devices.

Example embodiments provide that the first PDN includes a plurality of nodes connected to the plurality of semiconductor devices and a plurality of lines, the plurality of lines connecting each one of the plurality of nodes to at least one other node of the plurality of nodes, and each of the plurality of lines include at least one of a parasitic resistance and a parasitic capacitance.

Example embodiments provide that the number of the plurality of nodes is greater than or equal to the number of the plurality of semiconductor devices.

Example embodiments provide that the plurality of nodes includes first state nodes and second state nodes, the first state nodes being ones of the plurality of nodes that are connected to the first semiconductor devices, the second state nodes being ones of the plurality of nodes that are connected to the second semiconductor devices. Example embodiments provide that in the reducing the first PDN to the second PDN, the PDN enhancement module is configured to remove second state nodes from among the plurality of nodes such that first state nodes remain in the second PDN; and form a plurality of compressive lines based on the plurality of lines, the plurality of compressive lines connecting each of the first state nodes to at least another one of the first state nodes.

Example embodiments provide that in the reducing the first PDN to the second PDN, the PDN enhancement module is further configured to remove third state nodes from the first PDN, the third state nodes being ones of the plurality of nodes that are not connected to the plurality of semiconductor devices.

Example embodiments provide that in forming the plurality of compressive lines, the PDN enhancement module is further configured to simplify the plurality of lines such that each of the plurality of compressive lines are positioned between each of the first state nodes, and each of the plurality of compressive lines include the parasitic resistance and the parasitic capacitance of corresponding ones of the plurality of lines that are connected to the second state nodes.

Example embodiments provide that the storage device is configured to store the second net list.

Example embodiments provide that the circuit simulation unit further includes a simulation module configured to simulate the circuit, and in the simulating, the simulation module is configured to identify an effect of noise of the second PDN exerted on the first semiconductor devices.

Example embodiments provide that the first PDN includes a first sub PDN connected to a power terminal and a second sub PDN connected to a ground terminal. The plurality of semiconductor devices are connected between the first sub PDN and the second sub PDN. Example embodiments provide that, in the reducing the first PDN to the second PDN, the PDN enhancement module is configured to reduce the first sub PDN and the second sub PDN.

At least one example embodiment relates to a non-transitory computer-readable recording medium including program code for modeling a circuit. The program code, when executed by a processor, configures the processor to simulate a circuit.

According to an example embodiment a non-transitory computer-readable recording medium includes program code for modeling a circuit. The program code, when executed by a processor, configures the processor to provide a first net list including (i) a plurality of semiconductor devices, (ii) a first power distribution network (PDN) connected to the plurality of semiconductor devices, and (iii) a signal network connected to the plurality of semiconductor devices, where the signal network is configured to transmit signals to the plurality of semiconductor devices; determine first semiconductor devices and second semiconductor devices from among the plurality of semiconductor devices, the first semiconductor devices being ones from among the plurality of semiconductor devices that are activated by receiving the signal through the signal network and the second semiconductor devices being ones from among the plurality of semiconductor devices that are inactive; reduce the first PDN to a second PDN based on the determined first semiconductor devices; and simulate the circuit using a second net list including the first semiconductor devices, the signal network, and the second PDN.

Example embodiments provide that the first PDN includes a plurality of nodes connected to the plurality of semiconductor devices and a plurality of lines connecting each one of the plurality of nodes to at least one other node of the plurality of nodes. Each one of the plurality of lines includes at least one of a parasitic resistance and a parasitic capacitance.

Example embodiments provide that the plurality of nodes includes first state nodes and second state nodes, the first state nodes being ones of the plurality of nodes that are connected to the first semiconductor devices, the second state nodes being ones of the plurality of nodes that are connected to the second semiconductor devices. Example embodiments provide that in the reducing the first PDN to the second PDN, the processor is configured to remove second state nodes from among the plurality of nodes such that first state nodes remain in the second PDN; and form a plurality of compressive lines based on the plurality of lines, the plurality of compressive lines connecting each of the first state nodes to at least another one of the first state nodes.

Example embodiments provide that the plurality of compressive lines are formed such that each of the plurality of compressive lines is positioned between each of the first state nodes.

Example embodiments provide that each of the plurality of compressive lines include the parasitic resistance and the parasitic capacitance included in corresponding ones of the plurality of lines.

Example embodiments provide that in the simulating of the circuit, the processor is configured to simulate the circuit to identify an effect of noise of the second PDN exerted on at least one of the first semiconductor devices.

At least one example embodiment relates to a circuit modeling device for simulating a circuit.

According to an example embodiment, a the circuit modeling device comprising a processor configured to obtain a first net list, the first net list including (i) a plurality of semiconductor devices, (ii) a first power distribution network (PDN) connected to the plurality of semiconductor devices, and (iii) a signal network connected to the plurality of semiconductor devices, where the signal network is configured to transmit signals to the plurality of semiconductor devices; identify first semiconductor devices and second semiconductor devices from among the plurality of semiconductor devices, the first semiconductor devices being ones from among the plurality of semiconductor devices that are activated by receiving the signal through the signal network, the second semiconductor devices being ones from among the plurality of semiconductor devices that are inactive; reduce the first PDN to a second PDN based on the identified first semiconductor devices; generate a second net list including the signal network, the second PDN, and the first semiconductor devices; and simulate the circuit using the second net list.

Example embodiments provide that the first PDN includes a plurality of nodes connected to the plurality of semiconductor devices and a plurality of lines, the plurality of lines connecting each one of the plurality of nodes to at least one other node of the plurality of nodes, and each of the plurality of lines include at least one of a parasitic resistance and a parasitic capacitance.

Example embodiments provide that the plurality of nodes includes first state nodes and second state nodes. The first state nodes are ones of the plurality of nodes that are connected to the first semiconductor devices, and the second state nodes are ones of the plurality of nodes that are connected to the second semiconductor devices. Example embodiments provide that, in the reducing the first PDN to the second PDN, the processor is configured to remove the second state nodes from among the plurality of nodes such that first state nodes remain in the second PDN, and form a plurality of compressive lines based on the plurality of lines, the plurality of compressive lines connecting each of the first state nodes to at least another one of the first state nodes.

Example embodiments provide that in forming the plurality of compressive lines, the processor is configured to simplify the plurality of lines such that each of the plurality of compressive lines are positioned between each of the first state nodes, and each of the plurality of compressive lines include the parasitic resistance and the parasitic capacitance of corresponding ones of the plurality of lines that are connected to the second state nodes.

Example embodiments provide that the first PDN includes a first sub PDN connected to a power terminal and a second sub PDN connected to a ground terminal, the plurality of semiconductor devices are connected between the first sub PDN and the second sub PDN, and in the reducing the first PDN to the second PDN, the processor is configured to reduce the first sub PDN and the second sub PDN.

BRIEF DESCRIPTION OF THE DRAWINGS

The above and other features and advantages of the example embodiments will become more apparent by describing in detail preferred embodiments thereof with reference to the attached drawings in which:

FIG. 8 shows a flowchart illustrating a circuit modeling method according to an embodiment of the inventive concepts.

DETAILED DESCRIPTION OF THE EMBODIMENTS

Figure 1:
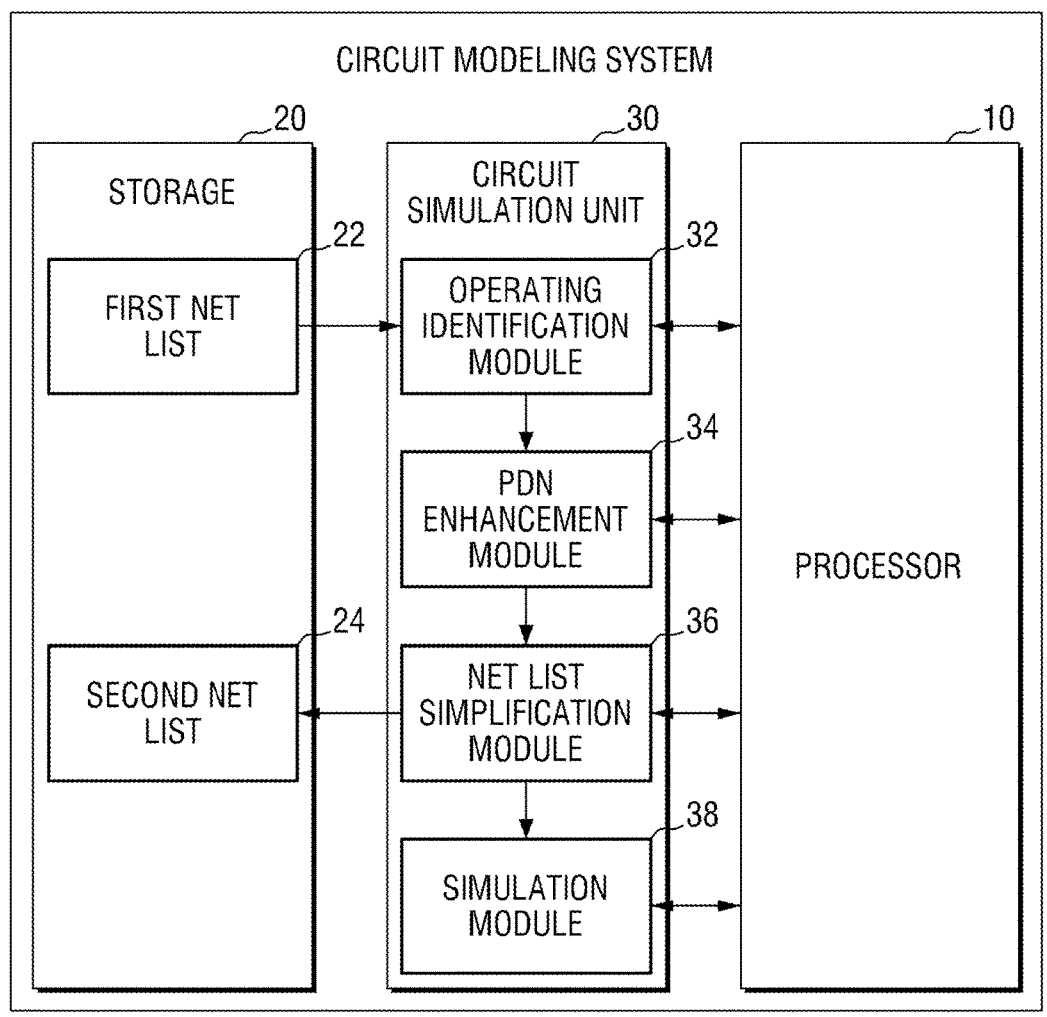
FIG. 1 is a block diagram of a circuit modeling system 1 according to an embodiment of the inventive concepts.

Inventive concepts will now be described more fully with reference to the accompanying drawings, in which example embodiments of are shown. These example embodiments are provided so that this disclosure will be thorough and complete, and will fully convey inventive concepts of to those skilled in the art. Inventive concepts may be embodied in many different forms with a variety of modifications, and a few embodiments will be illustrated in drawings and explained in detail. However, this should not be construed as being limited to example embodiments set forth herein, and rather, it should be understood that changes may be made in these example embodiments without departing from the principles and spirit of inventive concepts, the scope of which are defined in the claims and their equivalents. Like numbers refer to like elements throughout. In the drawings, the thicknesses of layers and regions are exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., electronic imaging systems, image processing systems, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible or non-transitory machine readable mediums for storing information. The term "computer-readable medium" may include, but is not limited to, portable or fixed storage devices, optical storage devices, and various other tangible or non-transitory mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, the circuit modeling system according to example embodiments of the inventive concepts will be described with reference to FIGS. 1 to 7.

FIG. 1 is a block diagram of a circuit modeling system 1 according to an embodiment of the present invention, and FIGS. 2 to 7 are schematic layout views for explaining the circuit modeling system 1 shown in FIG. 1.

As used herein, the "unit" or "module" refers to a software element and/or a hardware element, such as a Field Programmable Gate Array (FPGA) or an Application Specific Integrated Circuit (ASIC), which performs a desired (or alternatively, "predetermined") function. In some embodiments, the module may be constructed either to be stored in an addressable storage medium or to execute on one or more processors (e.g., processor 10). Therefore, the units and/or modules may include, software elements, object-oriented software elements, class elements or task elements, processes, functions, properties, procedures, sub-routines, segments of a program code, drivers, firmware, micro-codes, circuits, data, database, data structures, tables, arrays, parameters, and/or any other like elements. The elements and functions provided by the modules may be either combined into a smaller number of elements or modules or divided into a larger number of elements or modules.

Referring to FIG. 1, the circuit modeling system 1 includes a processor 10, a storage 20, and a circuit simulation unit 30. In some embodiments, the circuit modeling system 1 may include many more components than those shown in FIG. 1, such as a display device, one or more network interfaces, and/or other like physical hardware components. However, it is not necessary that all of these generally conventional components be shown in order to disclose the example embodiments.

The processor 10 may be used when the circuit simulation unit 30 performs logic operations. The processor 10 may be special purpose computer processing device configured to carry out program code stored in the storage 20 (e.g., storage 20) by performing arithmetical, logical, and input/output operations. The processor 10 may be an arithmetic logic unit, a digital signal processor, a microcomputer, a field programmable array, a programmable logic unit, a microprocessor or any other device capable of responding to and executing instructions in a defined manner such that the processor 10, when loaded with one or more units and/or modules, the processor 10 may be configured as a special purpose processor that performs operations for performing circuit modeling and/or circuit simulation according to the example embodiments. As shown, FIG. 1 illustrates only one processor 10. However, in some embodiments, the processor 10 may be plurally arranged. In other words, the circuit modeling system 1 illustrated in FIG. 1 may be modified such that the processor 10 can be driven under multi-core environments. In embodiments where the circuit modeling system 1 is driven under multi-core environments, the operation efficiency can be improved.

The storage 20 may be a computer readable storage medium that includes a random access memory (RAM), read only memory (ROM), a permanent mass storage device (such as a disk drive), and/or any other like data storage mechanism capable of storing and recording data. The storage 20 may be configured to store program code for one or more operating systems and/or program code for one or more software components such as the units and/or modules as discussed above. The units and/or modules may also be loaded from a separate computer readable storage medium into the storage 20 and/or the processor 10 using a drive mechanism (not shown). Such separate computer readable storage medium may include a floppy drive, disc, tape, optical disc drive (e.g., CD-ROM, DVD, Blu-Ray, and the like), memory card, and/or other like computer readable storage medium (not shown). In some embodiments, software components may be loaded into the storage 20 and/or the processor 10 from a remote data storage device via a network interface, rather than via a computer readable storage medium.

Figure 2:
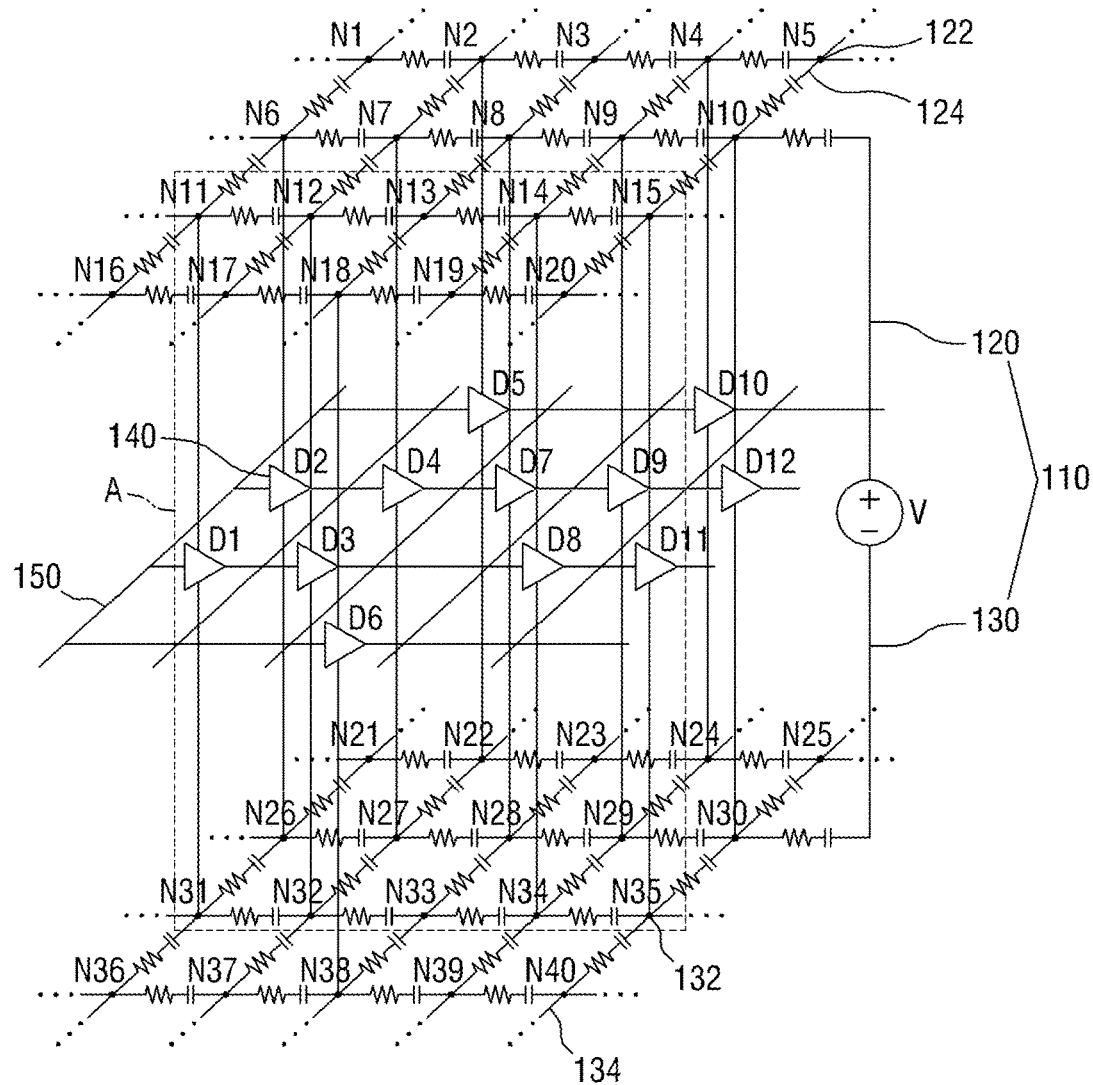
FIG. 2 illustrates a layout view of a portion of a first net list according to an example embodiment.

The first net list 22 may be stored in the storage 20. The first net list 22 may be a layout, diagram, and/or other like representation of a circuit of a semiconductor device to be subjected to simulation. Referring to FIG. 2, the first net list 22 may include a plurality of semiconductor devices 140, a first PDN 110, and a signal network 150. For example, when the first net list 22 is a layout for a static random access memory (SRAM) device and/or a logic device, the plurality of semiconductor devices 140 may be inverter cells. Aspects of the inventive concepts are not limited thereto, and in various embodiments, each of the plurality of semiconductor devices 140 may be any type of circuit element. In FIG. 1, only 12 semiconductor devices 140 are exemplified.

The signal network 150 is connected to the plurality of semiconductor devices 140 and transmits a signal 155 (as described below with respect to FIG. 4) to the plurality of semiconductor devices 140.

The first PDN 110 is connected to the plurality of semiconductor devices 140 and supplies power to the plurality of semiconductor devices 140. The first PDN 110 may include a first sub PDN 120 and a second sub PDN 130. The first sub PDN 120 may be connected to a power terminal and the second sub PDN 120 may be connected to a ground terminal. The plurality of semiconductor devices 140 may be positioned between the first sub PDN 110 and the second sub PDN 120; and the plurality of semiconductor devices 140 may be connected to the first sub PDN 110 and the second sub PDN 120. The first sub PDN 110 and the second sub PDN 120 may be substantially symmetrical to each other with the plurality of semiconductor devices 140 positioned therebetween.

The first PDN 110 may include a plurality of nodes 122 and 132 and a plurality of lines 124 and 134. The plurality of semiconductor devices 140 may be connected to the plurality of nodes 122 and 132. The power applied to the first sub PDN 120 may be transmitted from the plurality of nodes 122 of the first sub PDN 120 to the plurality of semiconductor devices 140. The plurality of semiconductor devices 140 may be connected to a ground terminal through the plurality of nodes 132 of the second sub PDN 130.

The plurality of lines 124 and 134 may connect the plurality of nodes 122 and 132 to each other. The plurality of lines 124 and 134 may have parasitic resistances and/or parasitic capacitances. Information on magnitudes of the parasitic resistances and/or the parasitic capacitances are stored in the first net list 22. The magnitudes of the parasitic resistances and/or the parasitic capacitances may be determined by a line type of the lines 124 and 134 and/or a line length of the lines 124 and 134. In some embodiments, the magnitudes of the parasitic resistances and/or the parasitic capacitances may be externally applied and stored in the first net list 22.

FIG. 2 illustrates a layout view of a portion of a first net list 22 according to an example embodiment. In FIG. 2, $1^{st}$ to 12th devices D1 to D12 and 1st to 40th nodes N1 to N40 are shown. The 1st to 12th devices D1 to D12 are illustrated as some of the plurality of semiconductor devices 140 and the 1st to 40th nodes N1 to N40 are illustrated as some of the plurality of nodes 122 and 132. It should be noted that in various embodiments the first net list 22 may include many more devices and/or nodes than are shown in FIG. 2. In such embodiments, since the plurality of lines 124 and 134 are positioned between the plurality of nodes 122 and 132, as the number of the nodes 122 and 132 increases, a number of the lines 124 and 134 may also increase.

In the embodiment shown in FIG. 2 the 1st device D1 is connected to the 11th node N11 and the 31st node N31, the 2nd device D2 is connected to the 6th node N6 and the 26th node N26, the 3rd device D3 is connected to the 12th node N12 and the 32nd node N32, the 4th device D4 is connected to the 7th node N7 and the 27th node N27, the 5th device D5 is connected to the 2nd node N2 and the 22nd node N22, the 6th device D6 is connected to the 18th node N18 and the 38th node N38, the 7th device D7 is connected to the 8th node N8 and the 28th node N28, the 8th device D8 is connected to the 14th node N14 and the 34th node N34, the 9th device D9 is connected to the 9th node N9 and the 29th node N29, the 10th device D10 is connected to the 4th node N4 and the 24th node N24, the 11th device D11 is connected to the 15th node N15 and the 35th node N35, and the 12th device D12 is connected to the 10th node N10 and the 30th node N30.

In FIG. 2, the first PDN 110 having a lattice structure is shown. However, aspects of the inventive concepts are not limited thereto, and the first PDN 110 may be arranged in any type of circuit structure.

Referring back to FIG. 1, the storage 20 may also include a second net list 24. The second net list 24 may be generated by the circuit simulation unit 30 and/or the circuit simulation unit 30 simulates a circuit using the second net list 24.

The circuit simulation unit 30 simulates a circuit using the first net list 22 by performing one or more operations once the circuit simulation unit is loaded into the processor 10. The circuit simulation unit 30 may include an operating identification module 32, a power distribution network (PDN) enhancement module 34, a net list simplification module 36, and a simulation module 38.

The operating identification module 32 discriminates or otherwise determines whether ones of the plurality of semiconductor devices 140 are active or inactive. The determination of whether ones of the plurality of semiconductor devices 140 are active or inactive may be based on whether the signal 155 is applied to ones of the plurality of semiconductor devices 140.

Figure 3:
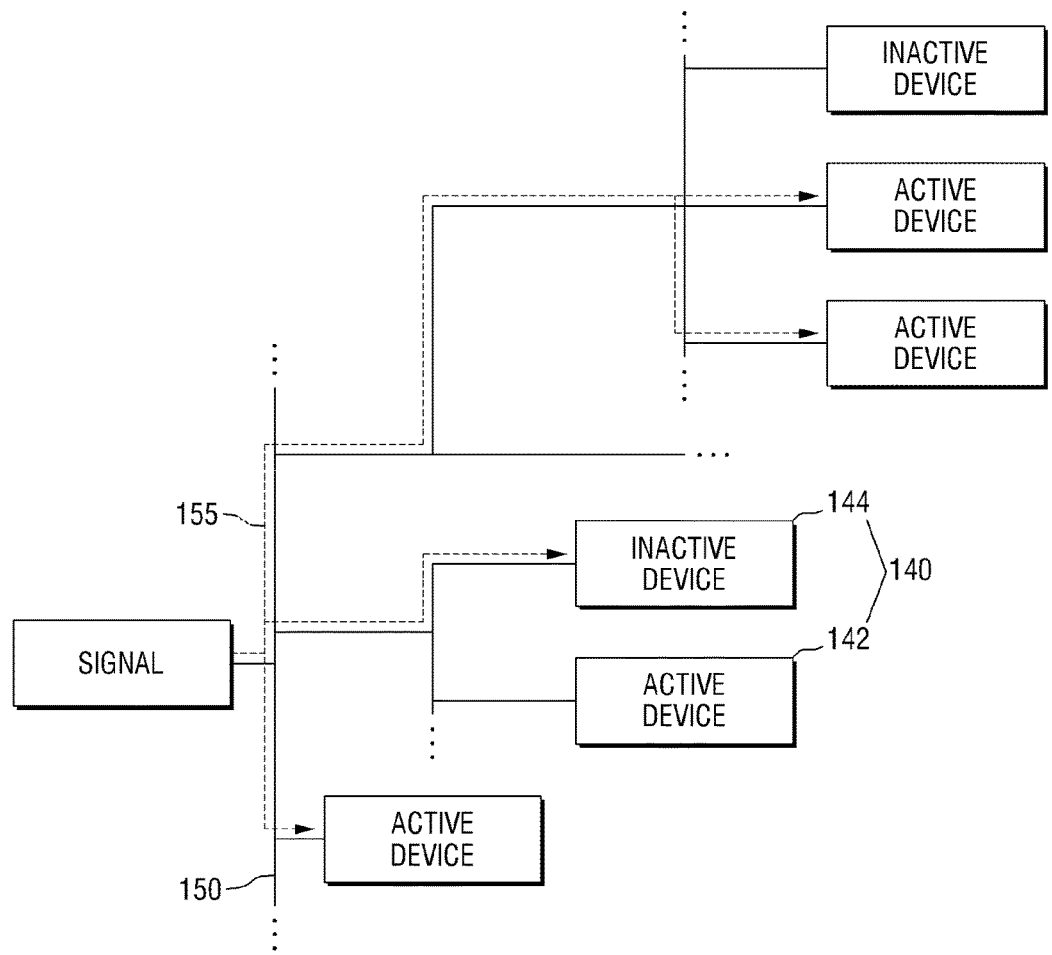
FIGS. 3 and 4 illustrate operations of an operating identification module shown in FIG. 1, according to an example embodiment.
Figure 4:
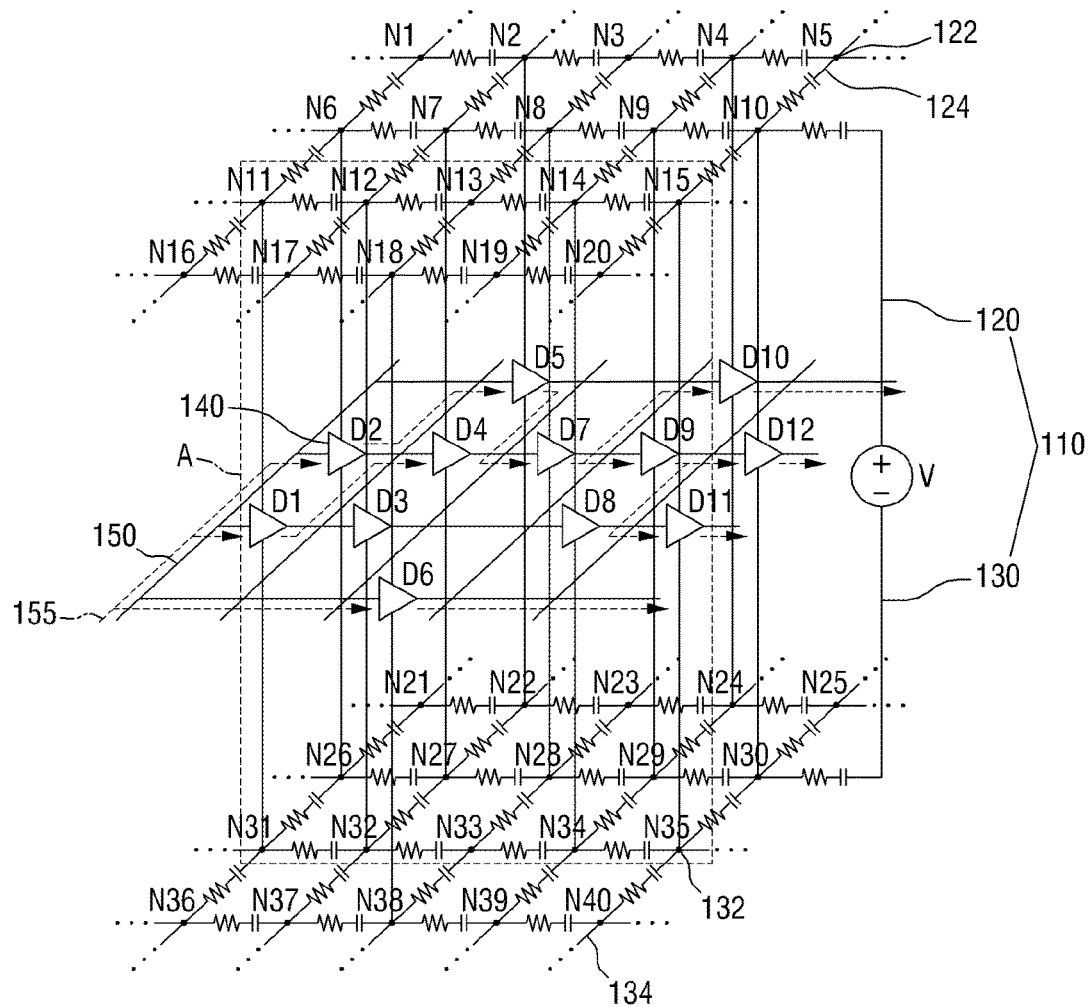

FIGS. 3 and 4 illustrate operations of an operating identification module 32 shown in FIG. 1 according to an example embodiment. Referring to FIG. 3, when the operating identification module 32 applies the signal 155 to the signal network 150, the applied signal 155 is transmitted to the plurality of semiconductor devices 140 through the signal network 150. In various embodiments, if the signal 155 is applied to the signal network 150, the signal 155 may not be transmitted to all of the plurality of semiconductor devices 140 at once, but may be transmitted to only some of the plurality of semiconductor devices 140. The plurality of semiconductor devices 140 may be classified into first semiconductor devices 142 that are activated according to a device type and/or content of the signal 155 applied to the circuit (e.g., read and/or write signals, a command signal, and/or the like) and second semiconductor devices 144 that are inactive because the signal 155 has not yet been transmitted thereto. The operating identification module 32 may discriminate the active first semiconductor devices 142 from the inactive second semiconductor devices 144.

FIG. 4 shows an example embodiment of the signal 155 being applied to the signal network 150. In FIG. 4, the first semiconductor devices from among, the plurality of semiconductor devices 140 (that correspond to the first semiconductor device 142 FIG. 3) that are activated by receiving the signal 155 include a 1st device D1, a 2nd device D2, a 4th device D4, a 5th device D5, a 7th device D7, a 9th device D9, a 10th device D10, a 11th device D11, and a 12th device D12. The inactive second semiconductor devices from among the plurality of semiconductor devices 140 (that correspond to the second semiconducter device 144 in FIG. 3) include a 3rd device D3 and an 8th device D8. As described above referring to FIGS. 2 and 3, the operating identification module 32 discriminates or otherwise determines the first semiconductor devices 142 and the second semiconductor devices 144 and transmits data regarding the first semiconductor devices 142 and second semiconductor devices 144 to the PDN enhancement module 34.

The PDN enhancement module 34 shrinks or otherwise reduces a first PDN 110 to a second PDN 210 (as described below with respect to FIG. 7) in consideration of the first semiconductor devices 142.

The process of the PDN enhancement module 34 shrinking and/or reducing the first PDN 110 will now be described with reference to FIGS. 4 to 7.

Referring to FIG. 4, the plurality of nodes 122 and 132 may be classified into first (1st) to third (3rd) state nodes. The first state nodes are nodes connected to the first semiconductor devices 142, including the 2nd node N2, the 4th node N4, the 6th node N6, the 7th node N7, an 8th node N8, the 9th node N9, the 10th node N10, an 11th node N11, the 15th node N15, an 18th node N18, the 22nd node N22, the 24th node N24, the 26th node N26, the 27th node N27, the 28th node N28, the 29th node N29, the 30th node N30, the 31st node N31, the 35th node N35, and the 38th node N38.

The second state nodes are nodes connected to the second semiconductor devices 144, including the 12th node N12, the 14th node N14, the 32nd node N32, and the 34th node N34.

The third state nodes are nodes that are not connected to the plurality of semiconductor devices 140, including the first node N1, the 3rd node N3, the 5th node N5, the 13th node N13, the 16th node N16, the 17th node N17, the 19th node N19, the 20th node N20, the 21st node N21, the 23rd node N23, the 25th node N25, the 33rd node N33, the 36th node N36, the 37th node N37, the 39th node N39, and a 40th node N40. According to various embodiments, the third state nodes may exist because the number of the plurality of nodes 122 and 132 is greater than the number of the plurality of semiconductor devices 140.

In FIG. 4, the PDN enhancement module 34 may remove second state nodes connected to the second semiconductor devices 144 and third state nodes that are not connected to the plurality of semiconductor devices 140.

Figure 5:
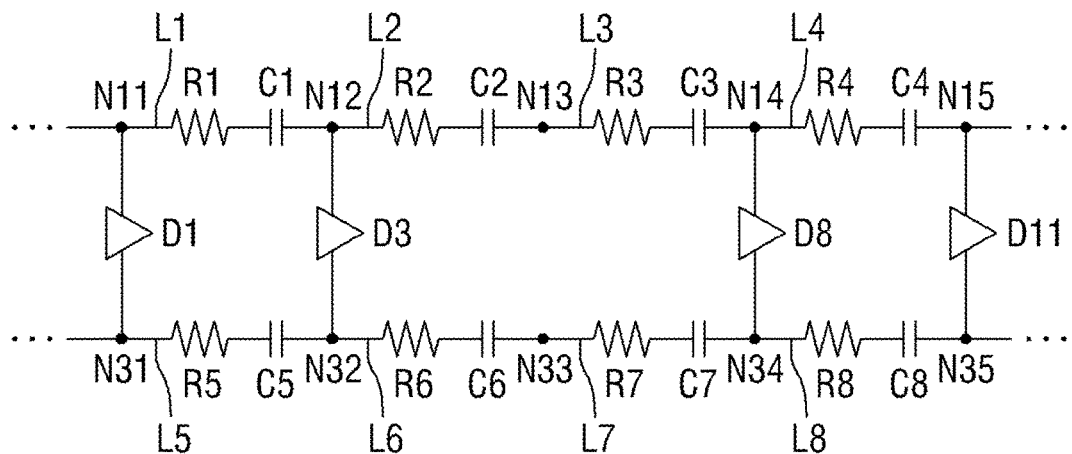
FIGS. 5 and 6 illustrate layout views of operations of a power distribution network (PDN) enhancement module according to an example embodiment.
Figure 6:
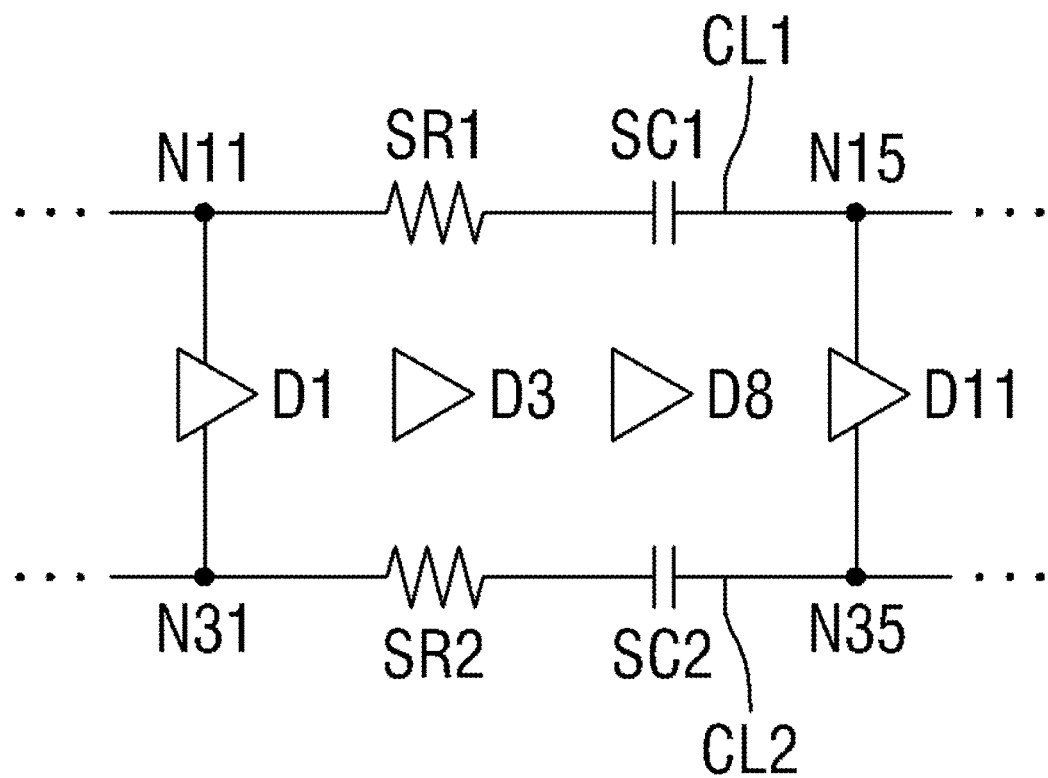

FIGS. 5 and 6 illustrate layout views of operations of a power distribution network (PDN) enhancement module 34 according to an example embodiment. FIG. 5 illustrates a portion 'A' of FIG. 4 according to an example embodiment. In FIG. 5, the first state nodes include the 11th node N11, the 15th node N15, the 31st node N31 and the 35th node N35, the second state nodes includes the 12th node N12, the 14th node N14, the 32nd node N32 and the 34th node N34, and the third state nodes include the 13th node N13 and the 33rd node N33. The 1st to 8th lines L1 to L8 connect the first to third state nodes. The 1st to 8th lines L1 to L8 include parasitic resistances R1 to R8 and parasitic capacitances C1 to C8, respectively.

The PDN enhancement module 34 removes the second state nodes connected to the second semiconductor devices 144 in a state such that the first state nodes connected to the first semiconductor devices 142 remain in the second PDN 210. Here, the third state nodes may be removed from the first PDN 110 and the second PDN 120, like the second state nodes. Referring to FIG. 6, the second state nodes connected to the second semiconductor devices 144, including the 12th node N12, the 14th node N14, the 32nd node N32 and the 34th node N34, are removed. Therefore, the 3rd device D3 and the 8th device D8 are disconnected from the first PDN 110. In addition, the third state nodes, including the 13th node N13 and the 33rd node N33, may also be removed.

Next, the plurality of lines 124 and 134 are simplified so as to connect the first state nodes to each other, thereby forming a plurality of compressive lines 224 and 234. In detail, the 1st to 4th lines L1, L2, L3 and L4 positioned between the 11th node N11 and the 15th node N15 may be replaced by a first compressive line CL1. The 5th to 8th lines L5, L6, L7 and L8 positioned between the 31st node N31 and the 35th node N35 may be replaced by a second compressive line CL2. In other words, one compressive line CL1 may be positioned between the 11th node N11 and the 15th node N15, and one compressive line CL2 may be positioned between the 31st node N31 and the 35th node N35.

The plurality of compressive lines 224 and 234 have parasitic resistances and parasitic capacitances of lines connected to the second state nodes. That is to say, the PDN enhancement module 34 may simplify the plurality of lines 124 and 134 such that all of the plurality of compressive lines 224 and 234 may have the parasitic resistances and/or the parasitic capacitances included in the plurality of lines 124 and 134.

FIG. 6 illustrates a reduction of FIG. 5 according to an example embodiment. In FIG. 6, the first compressive line CL1 may have parasitic resistances R1, R2, R3 and R4 and the parasitic capacitances C1, C2, C3 and C4 of the 1st to 4th lines L1, L2, L3 and L4, and the second compressive line CL2 may have the parasitic resistances R5, R6, R7 and R8 and the parasitic capacitances C5, C6, C7 and C8 of the 5th to 8th lines L5, L6, L7 and L8.

Values of the parasitic resistance SR1 and the parasitic capacitance SC1 included in the first compressive line CL1 are computed as follows:

$$SR1 = R1 + R2 + R3 + R4$$

$$1/SC1 = 1/C1 + 1/C2 + 1/C3 + 1/C4$$

where it is assumed that the 1st to 4th lines L1 to L4 are connected in series.

Values of the parasitic resistance SR2 and the parasitic capacitance SC2 included in the second compressive line CL2 are computed in the same manner as in the first compressive line CL1 as follows:

$$SR2 = R5 + R6 + R7 + R8$$

$$1/SC2 = 1/C5 + 1/C6 + 1/C7 + 1/C8$$

where it is assumed that the fifth to eighth lines L5 to L8 are connected in series.

In various embodiments, if the first PDN 110 shrinks to the second PDN 210, the parasitic resistances and the parasitic capacitances included in the first PDN 110 are kept in the second PDN 210. Thus, even if the circuit is modeled and/or simulated using the second PDN 210, a same or similar result as in modeling and/or simulating the circuit using the first PDN 110 can be obtained.

Referring back to FIG. 1, the PDN enhancement module 34 generates the second PDN 210 by shrinking the first PDN 110 by the same or similar method as discussed above with respect to FIGS. 5 and 6.

Figure 7:
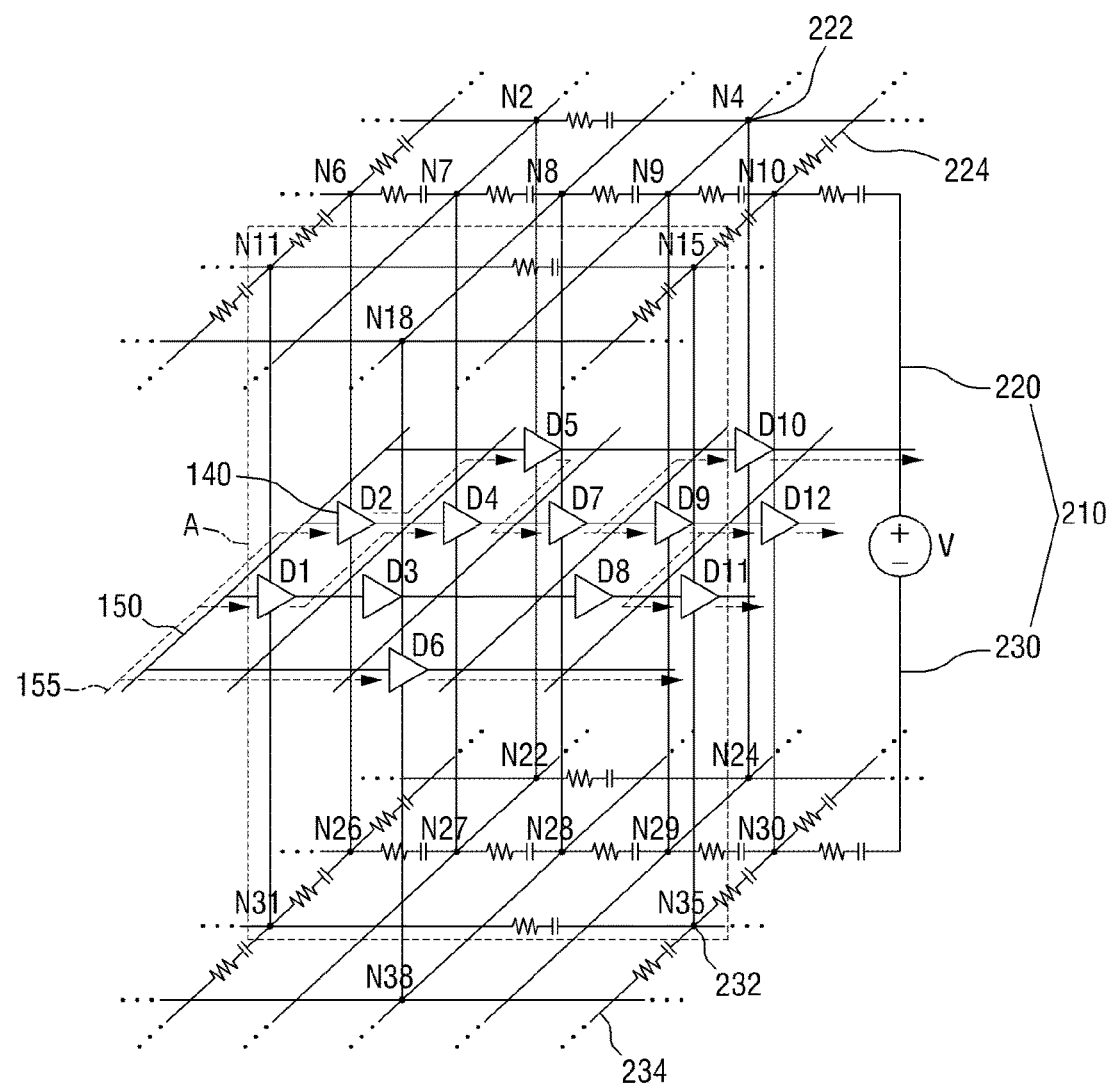
FIG. 7 illustrates a layout view of a portion of a second net list according to an example embodiment.

FIG. 7 illustrates a layout view of a portion of a second net list 24 according to an example embodiment. Referring to FIG. 7, the second PDN 210 may include a plurality of compressive lines 224 and 234 connecting the first state nodes 222 and 232 and the first state nodes 222 and 232 to each other.

The first PDN 110 includes a first sub PDN 120 and a second sub PDN 130 and the PDN enhancement module 34 may shrink both of the first sub PDN 120 and the second sub PDN 130. In detail, the first sub PDN 120 may shrink to a third sub PDN 220 and the second sub PDN 130 may shrink to a fourth sub PDN 230.

Referring back to FIG. 1, the net list simplification module 36 receives the second PDN 210 from the PDN enhancement module 34 and generates a second net list 24. As shown in FIG. 7, the second net list 24 may include a signal network 150, a second PDN 210, and first semiconductor devices 142. Additionally as shown in FIG. 7, the second net list 24 may include all of the first semiconductor devices 142 and the second semiconductor devices 144. However, since second state nodes do not exist in the second PDN 210, the second semiconductor devices 144 are not connected to the second PDN 210. In some embodiments, the second net list 24 may include only the first semiconductor devices 142 by removing the second semiconductor devices 144.

The net list simplification module 36 may store the second net list 24 in the storage 20.

Referring back to FIG. 1, a simulation module 38 may receive the second net list 24 from the net list simplification module 36 and may model and/or simulate the circuit. For example, the simulation module 38 may identify effects of noises of the second PDN 210, which are exerted on at least one of operations of the first semiconductor devices 142, output waveforms of the first semiconductor devices 142, and delays taken until the first semiconductor devices 142 operate.

The first net list 22 can be simplified by the circuit modeling system 1, and effects of noises of the first PDN 110, exerted on the circuit, can be identified within a short time.

A circuit modeling method according to example embodiments of the inventive concepts will be described with reference to FIGS. 1 to 8.

FIG. 8 shows a flowchart illustrating a circuit modeling method according to an example embodiment of the inventive concepts. The circuit modeling method of FIG. 8 may be performed by the circuit modeling system 1 depicted by FIGS. 1-7. In some embodiments, the circuit modeling method of FIG. 7 may be performed by any physical computing device that has the same or similar components as circuit modeling system 1 as discussed above with respect to FIGS. 1-7. For the sake of brevity, the same content as that of the previous example embodiments will not be repeatedly described.

First, referring to FIG. 8, as shown in operation S10, the circuit modeling system 1 obtains a first net list 22. As discussed above with respect to FIG. 2, the first net list 22 may be a layout, a diagram, and/or other like representation of a circuit of the semiconductor device. The first net list 22 may be used for simulating the circuit and may include a plurality of semiconductor devices 140, a first PDN 110 connected to the plurality of semiconductor devices 140, and a signal network 150 connected to the plurality of semiconductor devices 140, which may be used to transmit a signal to the plurality of semiconductor devices 140.

The first PDN 110 may include a plurality of nodes 122 and 132 connected to the plurality of semiconductor devices 140 and a plurality of lines 124 and 134 connecting the plurality of nodes 122 and 132 to each other. The nodes 122 of the first sub PDN 120 may be connected to a power terminal and the nodes 132 of the second sub PDN 130 may be connected to a ground terminal. The plurality of semiconductor devices 140 may be connected to the nodes 122 of the first sub PDN 120 and the nodes 132 of the second sub PDN 130 and may be positioned between the first nodes 122 and the second nodes 132. The plurality of lines 124 and 134 may have parasitic resistances and parasitic capacitances, respectively.

As shown in operation S20, the circuit modeling system 1 determines which ones of the plurality of semiconductor devices 140 are first semiconductor devices 142 and second semiconductor devices 144. The first semiconductor devices 142 may be ones of the plurality of semiconductor devices 140 that are activated by receiving a signal 155 through the signal network 150 The second semiconductor devices 144 may be ones of the plurality of semiconductor devices 140 that are inactive and/or do not receiving a signal 155 through the signal network 150.

As shown in operation S30, the circuit modeling system 1 shrinks or otherwise reduces the first PDN 110 to the second PDN 210. The first PDN 110 may be allowed to shrink to the second PDN 210 in consideration of the second semiconductor devices 144. That is to say, desired portions of first PDN 110 that are desired or required for modeling and/or simulating the circuit are left intact, the remaining portions are shrunk or otherwise reduced for modeling and/or simulating.

In detail, according to the example embodiments as discussed above with respect to FIGS. 1-7, among the plurality of nodes 122 and 132, second state nodes N12, N14, N32 and N34 connected to the second semiconductor devices 144 are removed in a state in which first state nodes N2, N4, N6, N7, N8, N9, N10, N11, N15, N18, N22, N24, N26, N27, N28, N29, N30, N31, N35 and N38, which are connected to the first semiconductor devices 142, that is, D1 to D2, D4 to D7, and D9 to D12 are left intact. At this time, third state nodes N1, N3, N5, N3, N13, N16, N17, N19, N20, N21, N23, N25, N23, N33, N36, N37, N39 and N40 may also be removed. The plurality of compressive lines 224 and 234 may be formed by simplifying the plurality of lines 124 and 134 so as to connect the first nodes to each other. The plurality of compressive lines 224 and 234 may be formed such that each one of the plurality of compressive lines 224 and 234 is positioned between the first state nodes. IN addition, the plurality of compressive lines 224 and 234 may include parasitic resistances and/or parasitic capacitances included in the plurality of lines 124 and 134 as they are.

As shown in operation S40, the circuit modeling system 1 models and/or simulates the circuit using the second net list 24 including the first semiconductor devices 142, the signal network 150, and the second PDN 210. As the simulation result of the circuit, effects of noises of the second PDN 210, exerted on at least one of operations and output waveforms of the first semiconductor devices 142, can be identified.

Once the circuit modeling system 1 models and/or simulates the circuit in operation S40, the circuit modeling method ends.

The circuit modeling method according to the example embodiments of the inventive concepts can be implemented as computer readable codes in computer readable recording media. The computer readable recording media include all kinds of recording apparatuses in which data that can be read by a computer system is stored. Functional programs, codes, and code segments for implementing the recording/reproducing method can be easily construed by programmers skilled in the art. Such computer readable recording media are ROM, RAM, CD-ROM, magnetic tape, floppy disk, and optical data storage, and transmissions via the Internet (e.g., carrier wave). The computer readable recording media can be distributed in a computer system connected to a network, and can be stored and operated in forms of computer readable codes.

While the inventive concepts have been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A circuit modeling system comprising:
   a storage device configured to store a first net list, the first net list including (i) a plurality of semiconductor devices, (ii) a first power distribution network (PDN) connected to the plurality of semiconductor devices, and (iii) a signal network connected to the plurality of semiconductor devices that transmits signals to the plurality of semiconductor devices; and
   a processor including a circuit simulation unit configured to simulate a circuit with the first net list, the processor configured to,
      identify first semiconductor devices and second semiconductor devices from among the plurality of semiconductor devices, the first semiconductor devices being ones from among the plurality of semiconductor devices that are activated by receiving the signal through the signal network, the second semiconductor devices being ones from among the plurality of semiconductor devices that are inactive,
      reduce the first PDN to a second PDN based on the identified first semiconductor devices, generate a second net list including the signal network, the second PDN, and the first semiconductor devices, and simulate the circuit based on the second net list.

2. The circuit modeling system of claim 1, wherein the first PDN includes a plurality of nodes connected to the plurality of semiconductor devices and a plurality of lines, the plurality of lines connecting each one of the plurality of nodes to at least one other node of the plurality of nodes, and each of the plurality of lines include at least one of a parasitic resistance and a parasitic capacitance.

3. The circuit modeling system of claim 2, wherein a number of the plurality of nodes is greater than or equal to the number of the plurality of semiconductor devices.

4. The circuit modeling system of claim 2, wherein the plurality of nodes includes first state nodes and second state nodes, the first state nodes being ones of the plurality of nodes that are connected to the first semiconductor devices, the second state nodes being ones of the plurality of nodes that are connected to the second semiconductor devices, and the processor is configured to reduce the first PDN to the second PDN by, removing second state nodes from among the plurality of nodes such that first state nodes remain in the second PDN, and forming a plurality of compressive lines based on the plurality of lines, the plurality of compressive lines connecting each of the first state nodes to at least another one of the first state nodes.

5. The circuit modeling system of claim 4, wherein the processor is further configured to reduce the first PDN to the second PDN by removing third state nodes from the first PDN, the third state nodes being ones of the plurality of nodes that are not connected to the plurality of semiconductor devices.

6. The circuit modeling system of claim 4, wherein the processor is further configured to form the plurality of compressive lines by simplifying the plurality of lines such that each of the plurality of compressive lines are between each of the first state nodes, and each of the plurality of compressive lines includes a parasitic resistance and a parasitic capacitance of corresponding ones of the plurality of lines that are connected to the second state nodes.

7. The circuit modeling system of claim 1, wherein the storage device is configured to store the second net list.

8. The circuit modeling system of claim 1, wherein the processor is further configured to simulate the circuit by identifying an effect of noise of the second PDN exerted on the first semiconductor devices.

9. The circuit modeling system of claim 1, wherein the first PDN includes a first sub PDN connected to a power terminal and a second sub PDN connected to a ground terminal, the plurality of semiconductor devices are connected between the first sub PDN and the second sub PDN, and the processor is further configured to reduce the first sub PDN and the second sub PDN.

10. A non-transitory computer-readable recording medium comprising program code for modeling a circuit, the program code, when executed by a processor, configures the processor to:

provide a first net list including (i) a plurality of semiconductor devices, (ii) a first power distribution network (PDN) connected to the plurality of semiconductor devices, and (iii) a signal network connected to the plurality of semiconductor devices, the signal network being configured to transmit signals to the plurality of semiconductor devices;

determine first semiconductor devices and second semiconductor devices from among the plurality of semiconductor devices, the first semiconductor devices being ones of the plurality of semiconductor devices that are activated by receiving the signal through the signal network and the second semiconductor devices being ones of the plurality of semiconductor devices that are inactive;

reduce the first PDN to a second PDN based on the determined first semiconductor devices; and simulate the circuit using a second net list including the first semiconductor devices, the signal network, and the second PDN.

11. The non-transitory computer-readable recording medium of claim 10, wherein the first PDN includes a plurality of nodes connected to the plurality of semiconductor devices and a plurality of lines connecting each one of the plurality of nodes to at least one other node of the plurality of nodes, each of the plurality of lines including at least one of a parasitic resistance and a parasitic capacitance.

12. The non-transitory computer-readable recording medium of claim 11, wherein the plurality of nodes includes first state nodes and second state nodes, the first state nodes being ones of the plurality of nodes that are connected to the first semiconductor devices, the second state nodes being ones of the plurality of nodes that are connected to the second semiconductor devices, and the processor is configured to reduce the first PDN to the second PDN by, removing second state nodes from among the plurality of nodes such that first state nodes remain in the second PDN, and forming a plurality of compressive lines based on the plurality of lines, the plurality of compressive lines connecting each of the first state nodes to at least another one of the first state nodes.

13. The non-transitory computer-readable recording medium of claim 12, wherein the plurality of compressive lines are formed such that each of the plurality of compressive lines is positioned between two of the first state nodes.

14. The non-transitory computer-readable recording medium of claim 12, wherein each of the plurality of compressive lines include the parasitic resistance and the parasitic capacitance included in corresponding ones of the plurality of lines.

15. The non-transitory computer-readable recording medium of claim 10, wherein the processor is configured to simulate the circuit by simulating the circuit to identify an effect of noise of the second PDN exerted on at least one of the first semiconductor devices.

16. A circuit modeling device for simulating a circuit, the circuit modeling device comprising a processor configured to:

obtain a first net list, the first net list including (i) a plurality of semiconductor devices, (ii) a first power distribution network (PDN) connected to the plurality of semiconductor devices, and (iii) a signal network connected to the plurality of semiconductor devices, the signal network being configured to transmit signals to the plurality of semiconductor devices;

identify first semiconductor devices and second semiconductor devices from among the plurality of semiconductor devices, the first semiconductor devices being ones from among the plurality of semiconductor devices that are activated by receiving the signal through the signal network, the second semiconductor devices being ones from among the plurality of semiconductor devices that are inactive;

reduce the first PDN to a second PDN based on the identified first semiconductor devices;

generate a second net list including the signal network, the second PDN, and the first semiconductor devices; and simulate the circuit using the second net list.

17. The circuit modeling device of claim 16, wherein the first PDN includes a plurality of nodes connected to the plurality of semiconductor devices and a plurality of lines, the plurality of lines connecting each one of the plurality of nodes to at least one other node of the plurality of nodes, and each of the plurality of lines include at least one of a parasitic resistance and a parasitic capacitance.

18. The circuit modeling device of claim 17, wherein the plurality of nodes includes first state nodes and second state nodes, the first state nodes being ones of the plurality of nodes that are connected to the first semiconductor devices, the second state nodes being ones of the plurality of nodes that are connected to the second semiconductor devices, and the processor is configured to reduce the first PDN to the second PDN by, removing the second state nodes from among the plurality of nodes such that first state nodes remain in the second PDN, and forming a plurality of compressive lines based on the plurality of lines, the plurality of compressive lines connecting each of the first state nodes to at least another one of the first state nodes.

19. The circuit modeling device of claim 18, wherein the processor is configured to form the plurality of compressive lines by simplifying the plurality of lines such that each of the plurality of compressive lines are between two of the first state nodes, and each of the plurality of compressive lines includes a parasitic resistance and a parasitic capacitance of corresponding ones of the plurality of lines that are connected to the second state nodes.

20. The circuit modeling device of claim 16, wherein the first PDN includes a first sub PDN connected to a power terminal and a second sub PDN connected to a ground terminal, the plurality of semiconductor devices are connected between the first sub PDN and the second sub PDN, and the processor is configured to reduce the first PDN to the second PDN by reducing the first sub PDN and the second sub PDN.

* * * * *